(12) United States Patent
Koga

(10) Patent No.: US 8,466,551 B2
(45) Date of Patent: Jun. 18, 2013

(54) SEMICONDUCTOR DEVICE

(75) Inventor: Masuo Koga, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 77 days.

(21) Appl. No.: 13/187,711

(22) Filed: Jul. 21, 2011

(65) Prior Publication Data

US 2012/0119369 A1    May 17, 2012

(30) Foreign Application Priority Data

Nov. 11, 2010   (JP) .................................. 2010-252633

(51) Int. Cl.
  *H01L 23/48*   (2006.01)
(52) U.S. Cl.
  USPC ................. 257/734; 257/773; 257/E23.001; 257/E23.01; 257/E23.078; 439/271; 439/604; 439/954
(58) Field of Classification Search
  USPC .................... 257/734, 773, E23.001, E23.01, 257/E23.078; 439/271, 604, 954
  See application file for complete search history.

(56) References Cited

U.S. PATENT DOCUMENTS 5,667,392 A * 9/1997 Kocher et al. ................... 439/79
6,358,100 B1 * 3/2002 Watanabe et al. .......... 439/733.1

FOREIGN PATENT DOCUMENTS

JP    2009-88218    4/2009

* cited by examiner

*Primary Examiner* — Peniel M Gumedzoe
(74) *Attorney, Agent, or Firm* — Oblon, Spivak, McClelland, Mair & Neustadt, L.L.P.

(57) ABSTRACT

A semiconductor device includes a main current external electrode for connecting a high-voltage main current electrode of a power semiconductor element to the outside, and a resin case into which the main current external electrode is press fitted. The main current external electrode has a press-fitted fixing portion and a claw fixing portion for fixation to the resin case. The claw fixing portion includes a projection passing through a through hole defined in the resin case, and having a bendable claw portion at its tip end.

20 Claims, 3 Drawing Sheets

SEMICONDUCTOR DEVICE

BACKGROUND OF THE INVENTION

1. Field of the Invention

The present invention relates to a technique of fixing an external electrode in a high-voltage semiconductor power module.

2. Description of the Background Art

Semiconductor power modules used in electric railroads and others include those that require a high rated voltage (of 6500 V or higher) to bring about an advantage in constructing power units (as disclosed in Japanese Patent Application Laid-Open No. 2009-88218). Such semiconductor power modules should maintain isolation between a high-voltage part (collector) and a low-voltage part (emitter or gate).

In the case of an IGBT module, the IGBT module includes a collector main electrode, and a collector external electrode for connecting the collector main electrode to the outside that function as the high-voltage part. The collector external electrode is fixed by press fitting into a resin case to construct a power module, for the reason that this allows manufacture of the power module at low cost, for example.

However, the case may expand due to heat generation during the assembly so the fixation of the collector external may be loosened. As a result, the collector external electrode may be made unsteady, so it cannot be fixed securely in a final product.

SUMMARY OF THE INVENTION

It is an object of the present invention to provide a semiconductor device that achieves secure fixation of a collector external electrode.

The semiconductor device of the present invention includes a main current external electrode and a resin case. The main current external electrode connects a high-voltage main current electrode of a power semiconductor element to the outside. The main current external electrode is press fitted into the resin case. The main current external electrode has a press-fitted fixing portion and a claw fixing portion for fixation to the resin case. The claw fixing portion includes a projection. The projection passes through a through hole defined in the resin case, and has a bendable claw portion at its tip end.

The press-fitted fixing portion and the claw fixing portion realize multi-point secure fixation of the main current external electrode to the resin case. Further, the claw portion in a hooked state of the projection of the claw fixing portion allows the main current external electrode to be fixed more securely to the resin case.

These and other objects, features, aspects and advantages of the present invention will become more apparent from the following detailed description of the present invention when taken in conjunction with the accompanying drawings.

EMBODIMENT FOR CARRYING OUT THE INVENTION

Prerequisite Technique

Figure 6:
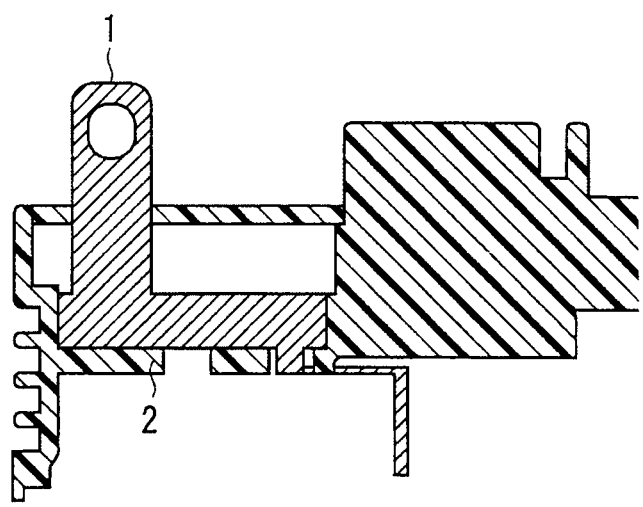
FIG. 6 is a sectional view of the structure of a semiconductor device according to a prerequisite technique.

FIG. 6 is a sectional view of the structure of a semiconductor device according to a prerequisite technique. A collector external electrode 1 is fixed by press fitting into a resin case 2 to construct a product, for the reason that this allows manufacture of the product at low cost, for example. However, the resin case 2 may expand due to heat generation during the assembly so the fixation of the collector external electrode 1 may be loosened. As a result, the collector external electrode 1 may be made unsteady in a final product. In response, the present invention provides the collector external electrode 1 with projections at several positions to allow the collector external electrode 1 to be fixed securely to the resin case 2.

First Preferred Embodiment

Structure

Figure 1:
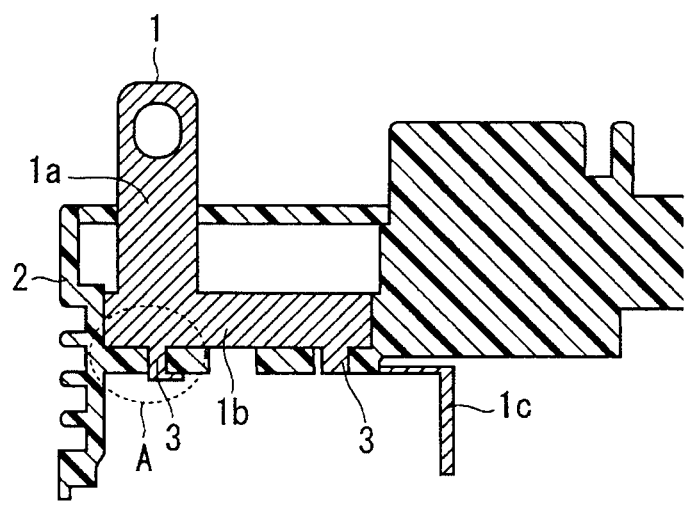
FIG. 1 is a sectional view of the structure of a semiconductor device of a first preferred embodiment.

FIG. 1 is a sectional view of the structure of a semiconductor device of a first preferred embodiment. The semiconductor device of the first preferred embodiment shown in FIG. 1 includes a collector external electrode 1 for connecting a collector electrode (not shown) of a power semiconductor element to the outside, and a resin case 2 into which the collector external electrode 1 is fixed by press fitting.

The collector external electrode 1 has a terminal section 1a connected to the outside, a press-fitted section 1b pressed fitted into the resin case 2, and a connecting section 1c connected to a power semiconductor element (not shown).

The collector external electrode 1 is fixed to the resin case 2 by abutting contact between the press-fitted section 1b and an inner wall of the resin case 2. Further, the press-fitted section 1b is given a plurality of projections 3 extending in a direction in which the collector external electrode 1 is press fitted into the resin case 2. The projections 3 are fitted into through holes defined in the resin case 2, thereby fixing the collector external electrode 1 to the resin case 2. One-point fixation of the collector external electrode 1 cannot prevent a shift in a direction of rotation with respect to the point at which the collector external electrode 1 is fixed. In contrast, the fixation of the collector external electrode 1 with the plurality of projections 3 allows the collector external electrode 1 to be fixed securely to the resin case 2.

Figure 2:
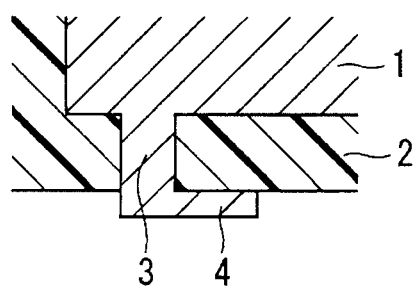
FIG. 2 is an enlarged sectional view of a claw portion and its vicinity.

At least one of the projections 3 passes through a through hole in the resin case 2 to expose its tip end, and the exposed tip end is bent to become a claw portion 4 extending along a surface of the resin case 2 in which the through hole is defined. FIG. 2 is an enlarged view of an area A shown in FIG. 1, and which shows the claw portion 4 and its vicinity. The collector external electrode 1 is fixed securely to the resin case 2 not only by the projections 3 engaging the resin case 2, but also by the claw portion 4 hooked on the resin case 2.

The projection 3 that does not have the claw portion 4 functions as a press-fitted fixing portion that is press fitted into a through hole to make the collector external electrode 1 fixed. The projection 3 having the claw portion 4 functions as a claw fixing portion that makes the collector external electrode 1 fixed by the hooked claw portion 4 in addition to press fitting thereof. The press-fitted fixing portion and the claw fixing portion together make the collector external electrode 1 fixed securely to the resin case 2.

In FIG. 1, two projections 3 are provided on the lower surface of the collector external electrode 1, and one of the two projections 3 is given the claw portion 4 at its tip end. Meanwhile, the number of projections 3 may arbitrarily be determined as long as two or more projections 3 are provided. Further, the number of projections 3 (claw fixing portions) having the claw portion 4 may also be determined arbitrarily.

Modifications

Figure 3:
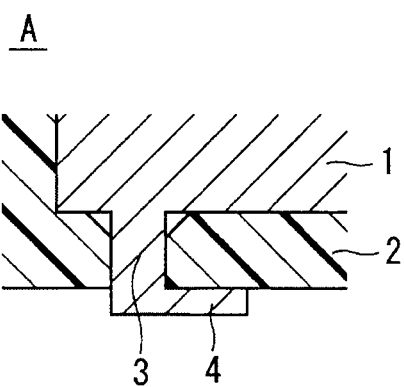
FIG. 3 is an enlarged sectional view of a claw portion and its vicinity in a modification of the first preferred embodiment.

An opening portion of the resin case 2 through which the projection 3 of the collector external electrode 1 is inserted into the resin case 2 may be beveled as shown in FIG. 3. This allows the collector external electrode 1 to be inserted into the resin case 2 with better workability. This effect may also be achieved by rounding the tip end of the projection 3 having the claw portion 4.

Effects

The semiconductor device of the first preferred embodiment includes the collector external electrode 1 (main current external electrode) for connecting a collector electrode (high-voltage main current electrode) of a power semiconductor element to the outside, and the resin case 2 into which the collector external electrode 1 is press fitted. The collector external electrode 1 has a press-fitted fixing portion and a claw fixing portion for fixation to the resin case 2. The claw fixing portion includes the projection 3 passing through a through hole defined in the resin case 2, and having the bendable claw portion 4 at its tip end. The press-fitted fixing portion and the claw fixing portion realize multi-point fixation of the collector external electrode 1, so that the collector external electrode 1 is fixed securely to the resin case 2. Further, the projection 3 of the claw fixing portion has the claw portion 4. So, the claw portion 4 in a hooked state allows the collector external electrode 1 to be fixed more securely to the resin case 2.

In the semiconductor device of the first preferred embodiment, an opening portion of a through hole defined in the resin case 2 may be beveled. This allows the projection 3 of the collector external electrode 1 to be fitted into the through hole of the resin case 2 with better workability.

In the semiconductor device of the first preferred embodiment, an end corner of the projection 3 may be rounded, so that the projection 3 is inserted into the resin case 2 with better workability.

Second Preferred Embodiment

Structure

Figure 4:
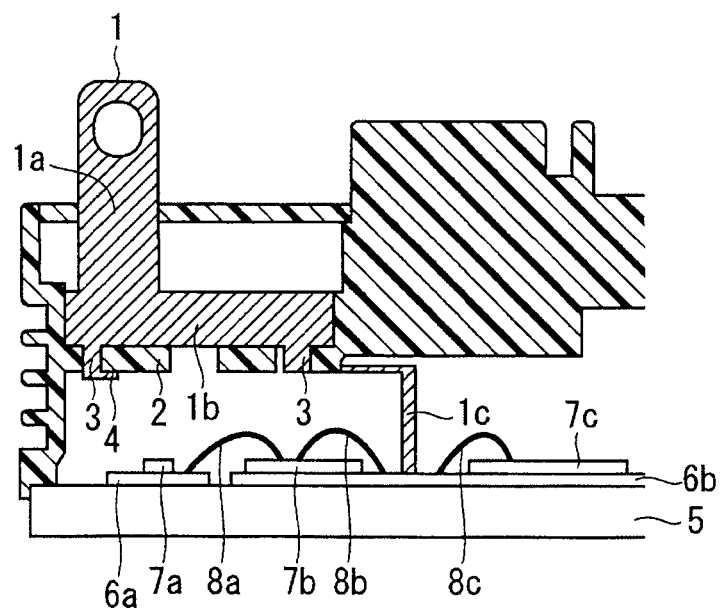
FIG. 4 is a sectional view of the structure of a semiconductor device of a second preferred embodiment.

FIG. 4 is a sectional view of the structure of a semiconductor device of a second preferred embodiment. A semiconductor element connected to the connecting section 1c of the collector external electrode 1 is also shown in FIG. 4. As shown in FIG. 4, substrates 6a and 6b are provided on a heat sink 5. Further, a semiconductor element 7a as a low-voltage part is provided on the substrate 6a, and power semiconductor elements 7b and 7c as high-voltage parts are provided on the substrate 6b. The substrate 6a and the semiconductor element 7b, the power semiconductor element 7b and the substrate 6b, and the substrate 6b and the power semiconductor element 7c are connected to each other through wires 8a, 8b and 8c. Although not shown, the semiconductor element 7a, the power semiconductor elements 7b and 7c, and the wires 8a, 8b and 8c are sealed together with the substrates 6a, 6b and 6c with an insulating sealing resin. As a result, the semiconductor element 7a as a low-voltage part is isolated from the collector external electrode 1 as a high-voltage part.

The low-voltage parts including the semiconductor element 7a, and the emitter wire 8a connected to a low-voltage main current electrode of the power semiconductor element 7b are placed near the bottom part of the terminal section 1a of the collector external electrode 1. So, the claw portion 4 and the low-voltage parts come close to each other if the claw portion 4 is provided at the center of the bottom part of the terminal section 1a as shown in FIG. 1. Such proximity does not present any problems in a power module having a low rated voltage (of 4500 V or lower), whereas it makes it difficult to maintain an insulation distance if the rated voltage increases (to 6500 V or higher). In response, in the second preferred embodiment, the claw portion 4 is provided at a position farther from the low-voltage part 7a than the center of the bottom part of the terminal section 1a as shown in FIG. 4. A resultant structure that provides a sufficient insulation distance is applicable to a high-voltage power module.

Modifications

Figure 5:
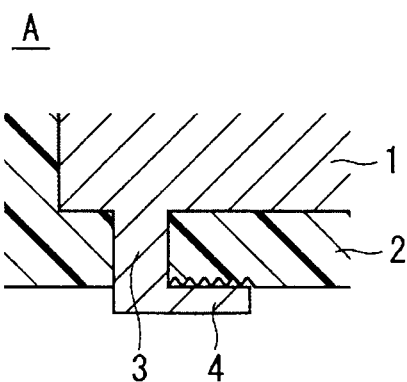
FIG. 5 is an enlarged sectional view of a claw portion and its vicinity in a modification of the second preferred embodiment.

A surface of the resin case 2 contacting the bent claw portion 4 may be given slots or recesses as shown in FIG. 5. This makes an insulation distance between the claw portion 4 and the low-voltage part 7a longer, thereby enhancing dielectric strength to a greater extent.

Effects

The semiconductor device of the second preferred embodiment further includes the low-voltage part 7a with the emitter wire 8a connected to a low-voltage main current electrode of a power semiconductor element. The low-voltage part 7a is provided on the substrate 6a and at a position near the bottom part of the main current external electrode (collector external electrode 1). The projection 3 with the claw portion 4 is provided at a position farther from the low-voltage part 7a than the center of the bottom part of the terminal section 1a of the collector external electrode 1. So, an insulation distance is maintained between the claw portion 4 and the low-voltage part 7a, thereby making the semiconductor device of the second preferred embodiment also applicable to a high-voltage power module.

In the semiconductor device of the second preferred embodiment, the substrate 6a with the low-voltage parts 7a and 8a is sealed with an insulating resin. So, isolation between the low-voltage part 7a, the claw portion 4, and the projection 3 with no claw portion 4 is maintained.

In the semiconductor device of the second preferred embodiment, a surface of the resin case 2 contacting the bent claw portion 4 is given irregularities. So, an insulation distance is maintained between the claw portion 4 and the low-voltage part 7a.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a main current external electrode for connecting a high-voltage main current electrode of a power semiconductor element to the outside;
   a resin case into which said main current external electrode is press fitted; and
   a low-voltage part with a wire connected to a low-voltage main current electrode of said power semiconductor element, the low-voltage part being provided on a substrate and at a position adjacent to a bottom part of said main current external electrode, wherein
   said main current external electrode has a press-fitted fixing portion and a claw fixing portion for fixation to said resin case,
   said claw fixing portion includes a projection passing through a through hole defined in said resin case, and having a bendable claw portion at its tip end, and said projection with said claw portion is provided at a position farther from said low-voltage part than the center of a bottom part of a terminal section of said main current external electrode.

2. The semiconductor device according to claim 1, wherein said substrate with said low-voltage part is sealed with an insulating resin.

3. The semiconductor device according to claim 1, wherein a surface of said resin case contacting a bent part of said claw portion is given irregularities.

4. The semiconductor device according to claim 1, wherein an opening portion of a through hole defined in said resin case is beveled.

5. The semiconductor device according to claim 1, wherein an end corner of said projection is rounded.

6. A semiconductor device, comprising:
   a main current external electrode for connecting a high-voltage main current electrode of a power semiconductor element to the outside; and
   a resin case into which said main current external electrode is press fitted, wherein
   said main current external electrode has a press-fitted fixing portion and a claw fixing portion for fixation to said resin case,
   said claw fixing portion includes a projection passing through a through hole defined in said resin case, and having a bendable claw portion at its tip end, and
   a surface of said resin case contacting a bent part of said claw portion is given irregularities.

7. The semiconductor device according to claim 6, further comprising a low-voltage part with a wire connected to a low-voltage main current electrode of said power semiconductor element, the low-voltage part being provided on a substrate and at a position adjacent to a bottom part of said main current external electrode, wherein
   said projection with said claw portion is provided at a position farther from said low-voltage part than the center of a bottom part of a terminal section of said main current external electrode.

8. The semiconductor device according to claim 7, wherein said substrate with said low-voltage part is sealed with an insulating resin.

9. The semiconductor device according to claim 6, wherein an opening portion of a through hole defined in said resin case is beveled.

10. The semiconductor device according to claim 6, wherein an end corner of said projection is rounded.

11. A semiconductor device, comprising:
    a main current external electrode connectable to a high-voltage main current electrode of a power semiconductor element to the outside; and
    a resin case into which said main current external electrode is press fitted, wherein
    said main current external electrode has a press-fitted fixing portion and a projection fixing said main current external electrode to said resin case, and
    said projection passing through a through hole defined in said resin case, and having a bent portion at its tip end.

12. The semiconductor device according to claim 11, further comprising a low-voltage part with a wire connected to a low-voltage main current electrode of said power semiconductor element, the low-voltage part being provided on a substrate and at a position adjacent to a bottom part of said main current external electrode, wherein
    said projection with said bent portion is provided at a position farther from said low-voltage part than the center of a bottom part of a terminal section of said main current external electrode.

13. The semiconductor device according to claim 12, wherein said substrate with said low-voltage part is sealed with an insulating resin.

14. The semiconductor device according to claim 11, wherein a surface of said resin case contacting a part of said bent portion is given irregularities.

15. The semiconductor device according to claim 11, wherein an opening portion of a through hole defined in said resin case is beveled.

16. The semiconductor device according to claim 11, wherein an end corner of said projection is rounded.

17. The semiconductor device according to claim 11, wherein said bent portion extends along a surface of said resin case in which said through hole is defined.

18. The semiconductor device according to claim 11, wherein said bent portion hooks on said resin case.

19. The semiconductor device according to claim 11, wherein said main current external electrode has a plurality of projections fixing said main current external electrode to said resin case.

20. The semiconductor device according to claim 19, wherein
    said plurality of projections has at least two projections, and
    at least one of said two projections has a bent portion at its tip end.

* * * * *